(12) United States Patent
Spriggs et al.

(10) Patent No.: US 6,414,900 B1
(45) Date of Patent: Jul. 2, 2002

(54) MEMORY DEVICE AND METHOD FOR HANDLING OUT OF RANGE ADDRESSES

(75) Inventors: Stephen W. Spriggs, Rowlett; George B. Jamison, Murphy, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,824

(22) Filed: Dec. 3, 2001

Related U.S. Application Data
(60) Provisional application No. 60/258,773, filed on Dec. 29, 2000.

(51) Int. Cl.[7] .............................................. G11C 8/00
(52) U.S. Cl. .............................. 365/230.06; 365/230.08
(58) Field of Search ....................... 365/230.06, 230.08; 326/105

(56) References Cited

U.S. PATENT DOCUMENTS 5,784,331 A * 7/1998 Lysinger ................ 365/230.06
5,933,386 A * 8/1999 Walker et al. ......... 365/230.08

* cited by examiner

Primary Examiner—Huan Hoang
(74) Attorney, Agent, or Firm—Robert D. Marshall, Jr.; W. James Brady, III; Frederick J. Telecky, Jr.

(57) ABSTRACT

A memory device (10) includes a memory array (12) having storage units (14) arranged in a plurality of rows (16). A row decoder (18) receives address information and determines which of the plurality of rows (16) to enable. According to the determined row (16), a row selector (20) drives the storage units (14) associated with the determined row (16) to provide their outputs onto respective bitlines (34) for identification by a bitline sensor (22). If the received address information indicates an out of range address that does not identify any of the plurality of rows (16) of the memory array (12), an out of range decoder (24) provides such determination to drive an out of range selector (26) to enable storage units (30) arranged in a single row (32) of a bitline driver (28). Outputs from the storage units (30) are applied to the respective bitlines (34) during an out of range address occurrence to prevent the bitlines (34) from being placed in an undesirable floating state.

20 Claims, 3 Drawing Sheets

MEMORY DEVICE AND METHOD FOR HANDLING OUT OF RANGE ADDRESSES

This application claims priority under 35 USC §119(e)(1) of Provisional Application No. 60/258,773, filed Dec. 29, 2000.

TECHNICAL FIELD OF THE INVENTION

The present invention relates in general to memory access technology and more particularly to a memory device and method for handling out of range addresses.

BACKGROUND OF THE INVENTION

Many applications require memories which only use a subset of the available address decode combinations. This occurs when the number of possible address combinations is greater than the number of physical locations being addressed within and assigned to a single memory device. A conventional memory device includes an array of memory cells accessed by a row select signal. As long as a valid address is applied, a single row is selected and each bitline for the selected row is driven to a known state by the selected memory cells. However, if an out of range address is applied, none of the rows within the memory device are selected, causing the bitlines to be undriven and float to an unknown logic state. If provisions are not made within the memory device to handle an out of range address, problems such as high current and/or metastability will occur.

Previous efforts to solve the out of range address problem include using a weak feedback latch on each bitline. The weak feedback latch holds the existing logic value on the bitline and keeps it from floating when no row is selected. This approach has the disadvantage of slowing read access times since the feedback latch is always active even when the address is valid and in range. When a valid in range address is applied and a row is selected, the memory cells are forced to overdrive the weak feedback latch whenever the logic state of the bitlines are changed. This performance penalty increases as the supply voltage is lowered. In extreme cases, if the weak feedback latch is not carefully designed, functional failures may occur for those memory cells unable to force the weak feedback latch to transition from one logic level to another.

Another technique for solving the floating bitline problem for out of range addresses includes using a voltage or current differential sensing scheme. However, this scheme has no provision to guarantee the data read from invalid address locations. It is assumed that slight imbalances in the feedback of the sense amplifier used in such a scheme will eventually cause the bitline to resolve to either one logic level or the other after some period of time. While it is true that the sense amplifier will eventually resolve to a full logic state, excess power is consumed every time an out of range address condition occurs. The excess power consumption results from the metastable condition created when the sense amplifier is enabled with no differential voltage present on the bitlines.

Thus, conventional approaches to solving the floating bitline problem add to the access time when reading from and writing to a memory device and add to the power consumption of the memory device. Therefore, it is desirable to prevent a bitline from floating upon the occurrence of an out of range address that substantially improves the access time and power consumption of the memory device.

SUMMARY OF THE INVENTION

From the foregoing, it mat be appreciated by those skilled in the art that a need has arisen for a memory device that can effectively handle out of range addresses. In accordance with the present invention, a memory device and method are provided that substantially eliminate or greatly reduce disadvantages and problems of conventional memory devices.

According to an embodiment of the present invention, there is provided a memory device for handling out of range addresses that includes a memory array having a plurality of storage units arranged in a plurality of rows and a bitline driver also having a plurality of storage units. A row decoder receives address information and determines which one of the plurality of rows of the memory array is to be accessed. A row selector selects one of the plurality of rows determined by the row decoder in order to output values stored in its associated storage units. An out of range decoder receives address information and determines that none of the plurality of rows of the memory array is to be accessed for the received address information. An out of range selector selects the storage units of the bitline driver in response to the out of range decoder determining that the received address information does not access any of the plurality of rows of the memory array in order to provide an output from the memory device.

The present invention provides various technical advantages over conventional memory devices. For example, one technical advantage is to eliminate the use of feedback latches and sense amplifiers to drive the bitlines of a memory during the occurrence of an out of range address. Another technical advantage is to detect for an out of range address. Yet another technical advantage is to drive the bitlines of the memory device upon the occurrence of an out of range address. Further technical advantages include predictable data output when accessing out of range addresses, faster access times, lower voltage functionality, and no floating bitlines. Other technical advantages may be readily apparent to those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
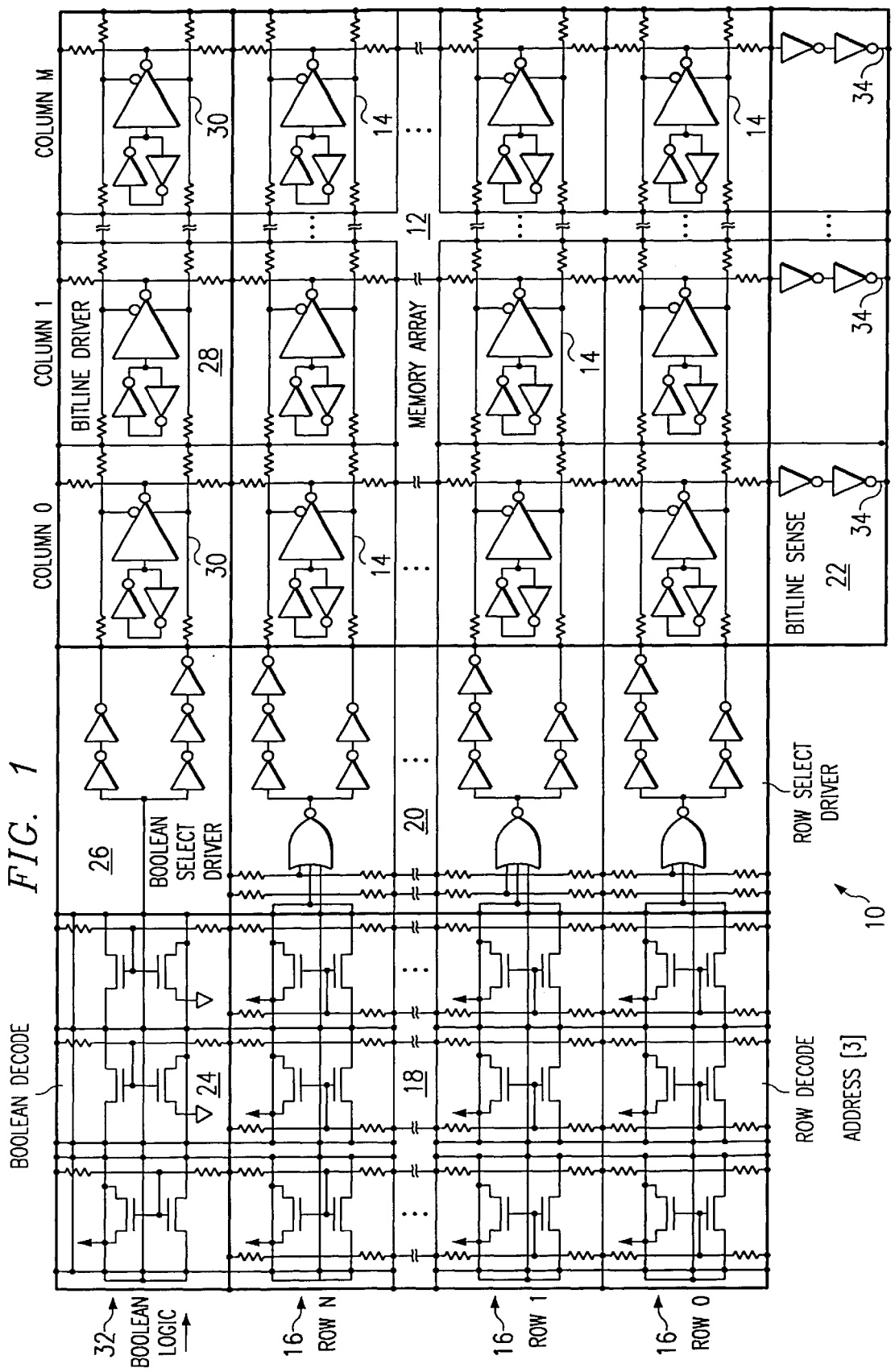
FIG. 1 illustrates a block diagram of one embodiment of a memory device.

FIG. 1 is a block diagram of a memory device 10. Memory device 10 includes a memory array 12 having a plurality of storage units 14 arranged in a plurality of rows 16. Memory device 10 includes a row decoder 18, a row selector 20, and a bitline sensor 22. Memory device also includes an out of range decoder 24, an out of range selector 26, and a bitline driver 28. Bitline driver 28 includes a plurality of storage units 30 arranged in a single row 32.

In normal operation, row decoder 18 receives address information and determines the appropriate row 16 corresponding to the received address information. The identified row 16 determined by row decoder 18 drives row selector 20 to enable storage units 14 associated with the identified row 16 to provide their outputs onto respective bitlines 34 for determination by bitline sensor 22.

During an out of range address situation, row decoder 18 does not drive any row 16 for row selector 20. In this situation, conventional memory devices would have their respective bitlines 34 in an undesirable floating state. However, in the present invention, out of range decoder 24 recognizes an occurrence of an out of range address and appropriately causes out of range selector 26 to drive bitline driver 28 in order to provide an output onto bitlines 34 from storage units 30 of single row 32. Storage units 30 may have pre-programmed values stored therein to indicate that an out of range address was received by memory device 10. Storage units 30, as well as storage units 14 in memory array 12, may include p-channel elements, n-channel elements, and/or a memory cell circuit as shown. Out of Range decoder 24 may identify an out of range address using boolean decoding techniques.

Figure 2:
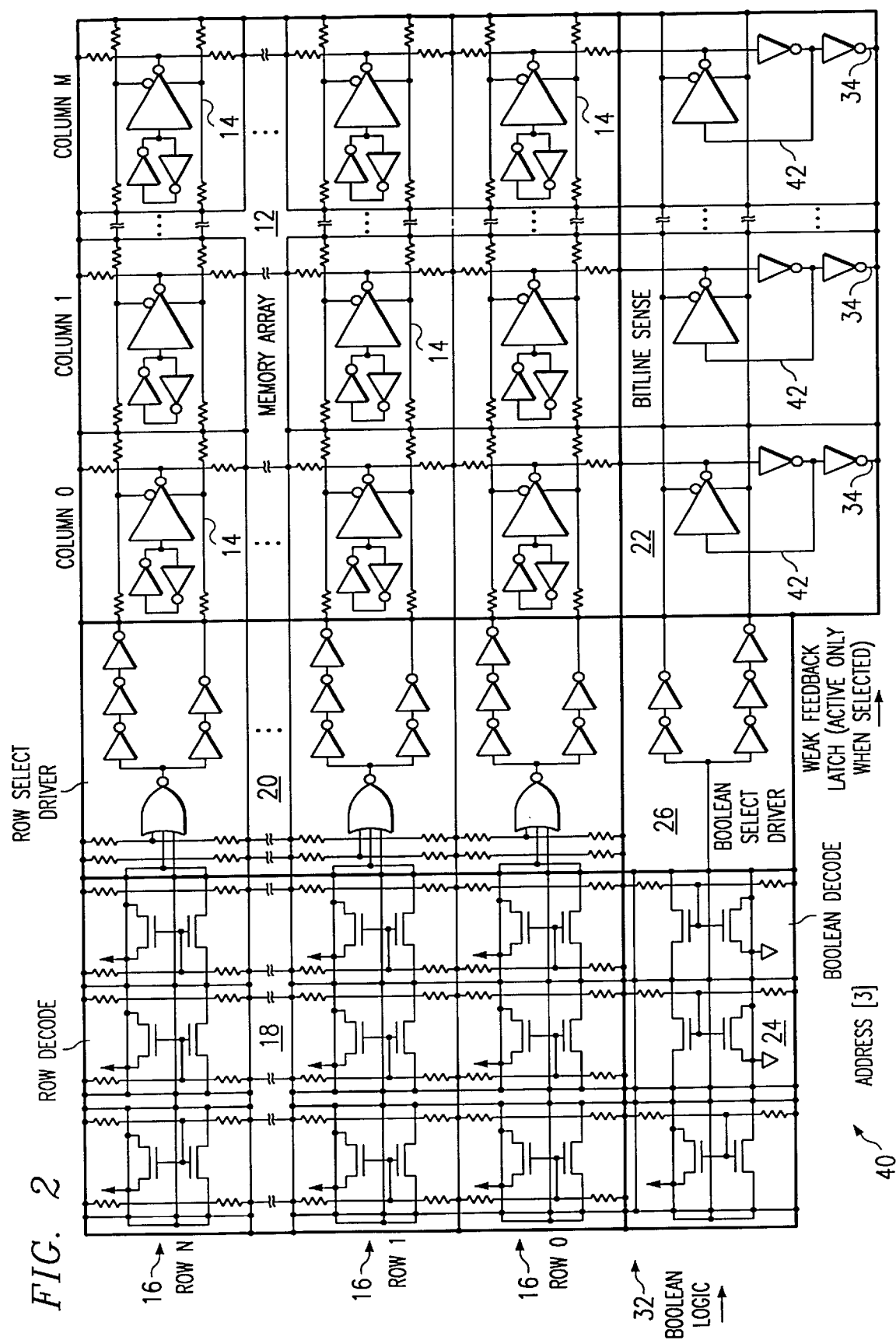
FIG. 2 illustrates a block diagram of an alternative design for the memory device.

FIG. 2 shows an alternative memory device 40. Memory device 40 uses a feedback latch 42 on each bitline 34 instead of a separate bitline driver 28 with storage units 30 found in memory device 10. Out of range decoder 24 identifies the occurrence of an out of range address and causes out of range selector 26 to enable feedback latches 42 on each bitline 34 of row 32. Feedback latches 42 hold the bitlines 34 at their previous state in order to provide outputs during an out of range address occurrence. Upon determination of a valid in range address, feedback latches 42 are disabled and the appropriate outputs from storage units 14 of the determined row 16 identified by row decoder 18 and row selector 20 may be placed onto respective bitlines 34.

Figure 3:
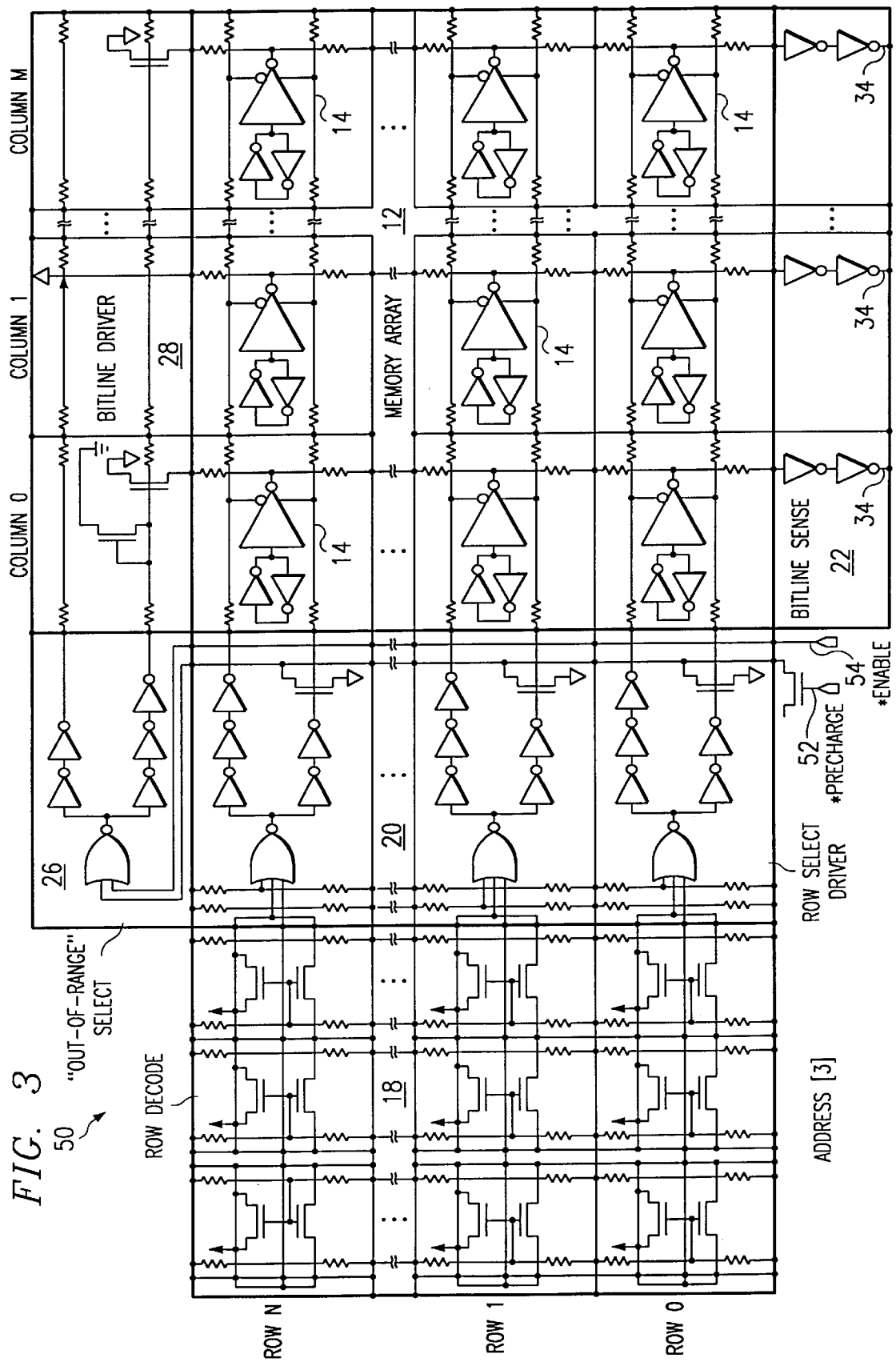
FIG. 3 illustrates a block diagram of another alternative design for the memory device.

FIG. 3 shows another alternative memory device 50. Memory device 50 is used in clocking implementations. Memory device 50 receives a precharge control signal on a precharge line 52 to precharge each row line 16 and the out of range row line 32. If row decoder 18 receives address information that indicates one of the plurality of rows 16 is to be accessed, row selector 20 allows the identified row 16 to pull down the precharge line to a logic low state so that values from storage units 14 of the identified row 16 are placed onto bitlines 34 upon receiving an enable control signal 54. This pulling down of the precharge line by the identified row 16 also disables out of range row 32 through appropriate logic in out of range selector 26.

If there is no row 16 identified by row decoder 18, then the address information indicates an out of range address. In this case, there is no pull down of precharge line 52 by any decoded row 16. By not being pulled down to a logic low state, precharge line 52 now activates out of range selector 26 to drive storage units 30 and provide output values therefrom onto bitlines 34 in response to enable control signal 54. In this manner, out of range addresses can be properly handled by memory device 50.

Thus, it is apparent that there has been provided, in accordance with the present invention, a memory device and method for handling out of range addresses that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A memory device for handling out of range addresses, comprising:
   a memory array having a plurality of storage units arranged in a plurality of rows;
   a bitline driver having a plurality of storage units;
   a row decoder operable to receive address information, the row decoder operable to determine which one of the plurality of rows of the memory array is to be accessed;
   a row selector operable to select one of the plurality of rows determined by the row decoder in order to output values stored in its associated storage units onto respective bitlines;
   an out of range decoder operable to receive address information, the out of range decoder operable to determine that none of the plurality of rows of the memory array is to be accessed for the received address information;
   an out of range selector operable to select the storage units of the bitline driver in response to the out of range decoder determining that the received address information does not access any of the plurality of rows of the memory array.

2. The memory device of claim 1, wherein the plurality of storage units of the bitline driver include pre-determined values programmed therein.

3. The memory device of claim 1, wherein each of the plurality of storage units of the bitline driver include a p-channel element.

4. The memory device of claim 1, wherein each of the plurality of storage units of the bitline driver include an n-channel element.

5. The memory device of claim 1, wherein each of the plurality of storage units of the bitline driver includes a memory cell circuit.

6. The memory device of claim 1, wherein each of the plurality of storage units of the bitline driver includes a feedback latch.

7. The memory device of claim 6, wherein the feedback latch of each of the plurality of storage units of the bitline driver are enabled upon determining that the address information does not access any of the plurality of rows of the memory array.

8. The memory device of claim 6, wherein the feedback latch of each of the plurality of storage units of the bitline driver maintains a previous value placed on the bitlines in response to the address information not accessing any of the plurality of rows of the memory array.

9. The memory device of claim 6, wherein the feedback latch of each of the plurality of storage units of the bitline driver is disabled upon determining that the address information accesses one of the plurality of rows of the memory array.

10. The memory device of claim 1, wherein the out of range selector includes a precharge control signal and an enable control signal.

11. A method for handling out of range addresses in a memory device, comprising:
   receiving address information;
   determining whether the address information accesses any of a plurality of rows of a memory array;
   enabling an out of range row outside of the memory array in response to the address information not accessing any of the plurality of rows of the memory array;
   providing values from the out of range row onto output bitlines.

12. The method of claim 11, wherein the values from the out of range row are provided by latching previous values onto the output bitlines.

13. the method of claim 12, wherein the latching is disabled upon determining that the address information accesses one of the plurality of rows of the memory array.

14. The method of claim 11, wherein determining the address information does not access any of the plurality of rows of the memory array includes performing a boolean decode on the address information.

15. The method of claim 11, wherein determining the address information does not access any of the plurality of rows of the memory array includes receiving a precharge control signal and an enable control signal to activate the out of range row.

16. A memory device for handling out of range addresses, comprising:
- a memory array having a plurality of storage units arranged in a plurality of rows, each storage unit of the memory array operable to provide an output onto an associated bitline, each storage unit being a memory cell circuit;
- a bitline driver having a plurality of storage units, each storage unit of the bitline driver operable to provide an output onto the associated bitlines;
- a row decoder operable to receive address information, the row decoder operable to determine which one of the plurality of rows of the memory array is to be accessed;
- a row selector operable to select one of the plurality of rows determined by the row decoder in order to output values stored in its associated storage units onto the associated bitlines;
- a boolean decoder operable to receive address information, the boolean decoder operable to determine that none of the plurality of rows of the memory array is to be accessed for the received address information;
- a boolean selector operable to select the storage units of the bitline driver in response to the boolean decoder determining that the received address information does not access any of the plurality of rows of the memory array.

17. The memory device of claim 16, wherein each storage unit of the bitline driver is preprogrammed with a value to output on the associated bitlines.

18. The memory device of claim 16, wherein each storage unit of the bitline driver includes a feedback latch enabled by the boolean selector.

19. The memory device of claim 18, wherein the feedback latch of each storage unit of the bitline driver is operable to maintain a previous output value on the associated bitlines upon being enabled.

20. The memory device of claim 16, wherein the storage units of the bitline driver include p-channel and/or n-channel elements.

* * * * *